United States Patent [19]

Shirota

[11] Patent Number: 5,357,472
[45] Date of Patent: Oct. 18, 1994

[54] NON-VOLATILE SEMICONDUCTOR MEMORY DEVICE

[75] Inventor: Shozo Shirota, Hyogo, Japan

[73] Assignee: Mitsubishi Denki Kabushiki Kaisha, Tokyo, Japan

[21] Appl. No.: 31,788

[22] Filed: Mar. 15, 1993

[30] Foreign Application Priority Data

Jun. 29, 1992 [JP] Japan .................................. 4-196186

[51] Int. Cl.⁵ .............................................. G11C 7/00
[52] U.S. Cl. .................. 365/201; 365/230.03; 365/230.06
[58] Field of Search ..................... 365/230.03, 230.06, 365/201

[56] References Cited

U.S. PATENT DOCUMENTS

| | | |
|---|---|---|
| 4,253,059 | 2/1981 | Bell et al. . |
| 4,583,205 | 4/1986 | Watanabe .............. 365/230.06 |
| 4,597,062 | 6/1986 | Asano et al. .............. 365/201 |
| 4,779,272 | 10/1988 | Kohda et al. ............ 365/201 |
| 4,958,324 | 9/1990 | Devin ...................... 365/201 |
| 5,109,257 | 4/1992 | Kondo .................... 365/201 |
| 5,126,970 | 6/1992 | Ul Haq ................ 365/230.03 |

FOREIGN PATENT DOCUMENTS

| | | |
|---|---|---|
| 3016176C2 | 2/1985 | Fed. Rep. of Germany . |
| 3249671C2 | 3/1988 | Fed. Rep. of Germany . |
| 3637682C2 | 10/1992 | Fed. Rep. of Germany . |

Primary Examiner—Eugene R. LaRoche
Assistant Examiner—F. Niranjan
Attorney, Agent, or Firm—Townsend and Townsend Khourie and Crew

[57] ABSTRACT

For directly observing from the outside the electrical characteristics of a memory cell, i.e., a voltage-current characteristic and threshold voltage in a non-volatile semiconductor memory device, there are provided same bit train selector means 5 for selecting and switching on a plurality of bit train selecting FETs($QB_o$, $QB_1$. . . . , $QB_n$) each for interconnecting an external terminal 4 to which arbitrary voltage is applied and respective memory cell arrays 1a, 1b, . . . , 1n with each other and forming a current path extending from a specific memory cell FET ($Q_1$) on the same bit train memory cell array to the external terminal, and a power supply circuit for supplying variable voltage to a gate of the specific memory cell FET ($Q_i$). Hereby, there are improved the yield of articles and the accuracy of failure article analyses.

9 Claims, 3 Drawing Sheets

NON-VOLATILE SEMICONDUCTOR MEMORY DEVICE

BACKGROUND OF THE INVENTION

1. Field of the Invention

The present invention relates to a non-volatile semiconductor memory device such for example as EPROMs and flash EEPPROMs, etc,

2. Description of the Prior Art

Typical non-volatile semiconductor memory devices conventionally include EPICOHs, flash EEPROMs, mask ROMs, and the like. For inspecting such non-volatile semiconductor memory devices or monitoring characteristics of memory cells, use is chiefly made in prior practice of a technique to read/write data from/in a memory device from the outside of the memory device, i,e, characteristics of a memory cell can only be viewed from the outside indirectly.

There is known for example as the technique to inspect memory devices a method wherein "0" or "1" is written in memory cells which is read out in turn and compared with each other in a bit unit to inspect whether or not an accurate write/read operation is achieved.

In the cases where the yield of articles is desired to be increased in a wafer process and failure product analyses are performed in a shipping/inspection process or after shipping, there frequently occur an inexpedient situation where it is insufficient only with the foregoing indirect technique and hence a need is produced of directly observing electric characteristics of memory cells, say, a drain voltage-drain current characteristic.

In prior art non-volatile semiconductor memory devices, however, such observation of tile electric characteristics of memory cells was obliged to rely upon laborious techniques such as probing using a needle. Even such probing was also impossible technically to be realized because of the recent progress of fine patterning of the wafer process, and made it impossible to directly observe the, electric characteristics of memory cells and lowered the yield of articles and the accuracy of analyses of failure articles.

To solve the problems with the prior art, it is an object of the present invention to provide a non-volatile semiconductor device wherein electric characteristic of memory cells allow a direct measurement thereof, and the yield of articles and the accuracy of failure article analyses can be improved.

SUMMARY OF THE INVENTION

To achieve the above object, a non-volatile semiconductor device according to the present invention includes a plurality of memory cell arrays $1a, 1b, \ldots, 1n$ each connected to the same bits of data bus D, each memory cell array comprising a plurality of memory cells (FET($Q_0, Q_1, \ldots, Q_n$)), each memory cell being composed or an element such as a transistor and an FET, a selector circuit (word line decoder circuit 2) for designating word lines $W_0, W_1, \ldots, W_n$ of the aforesaid memory cell array and switching on a control electrode (gate) of a memory cell connected to a designated word line, and a selector circuit (bit line selector circuit 3) for designating bit lines $S_0, S_1, \ldots$ of the foregoing memory cell arrays, whereby any data stored in a memory cell on each memory cell array selected by the respective selector circuits is read out/written in through the data bus, the nonvolatile semiconductor device further including an external terminal 4, a plurality of switching elements (bit train selecting FETs($QB_0, QB_1, \ldots QB_n$)) for connecting the foregoing memory cell arrays with the external terminal, and same bit train selector means 5 for selectively switching on the switching elements to form a current path extending from a specific memory cell of the same bit train memory cell array to the external terminal, whereby a current is driven to flow through the foregoing memory cell (FET($Q_i$)) mediating the current path by supplying arbitrary voltage to the external terminal.

A non-volatile semiconductor device according to another mode of the present invention includes additionally to the arrangement described above a power supply circuit 10 for supplying variable voltage to the control electrode of the aforesaid specific memory cell (FET($Q_i$)) through the word line designated by the foregoing selector circuit.

In accordance with the present invention, the same bit train selector means 5 selects a memory cell array of the same bit train to specify one memory cell on the memory cell array. Application of arbitrary voltage to the external terminal causes a current to flow through the specific memory cell, which current is in turn measured. Further, the power supply circuit 10 alters voltage to be applied to a control electrode of specific memory cell a current through which is to be measured, and threshold voltage of the specific memory cell is in turn measured.

The above and other objects, features, and advantages of the invention will become, more apparent from the following description when taken in conjunction with the accompanying drawings.

DESCRIPTION OF THE PREFERRED EMBODIMENTS

In the following, there will be described the first preferred embodiment of a non-volatile semiconductor memory device according to the present invention with reference to FIG. 1 and FIG. 2.

Figure 1:
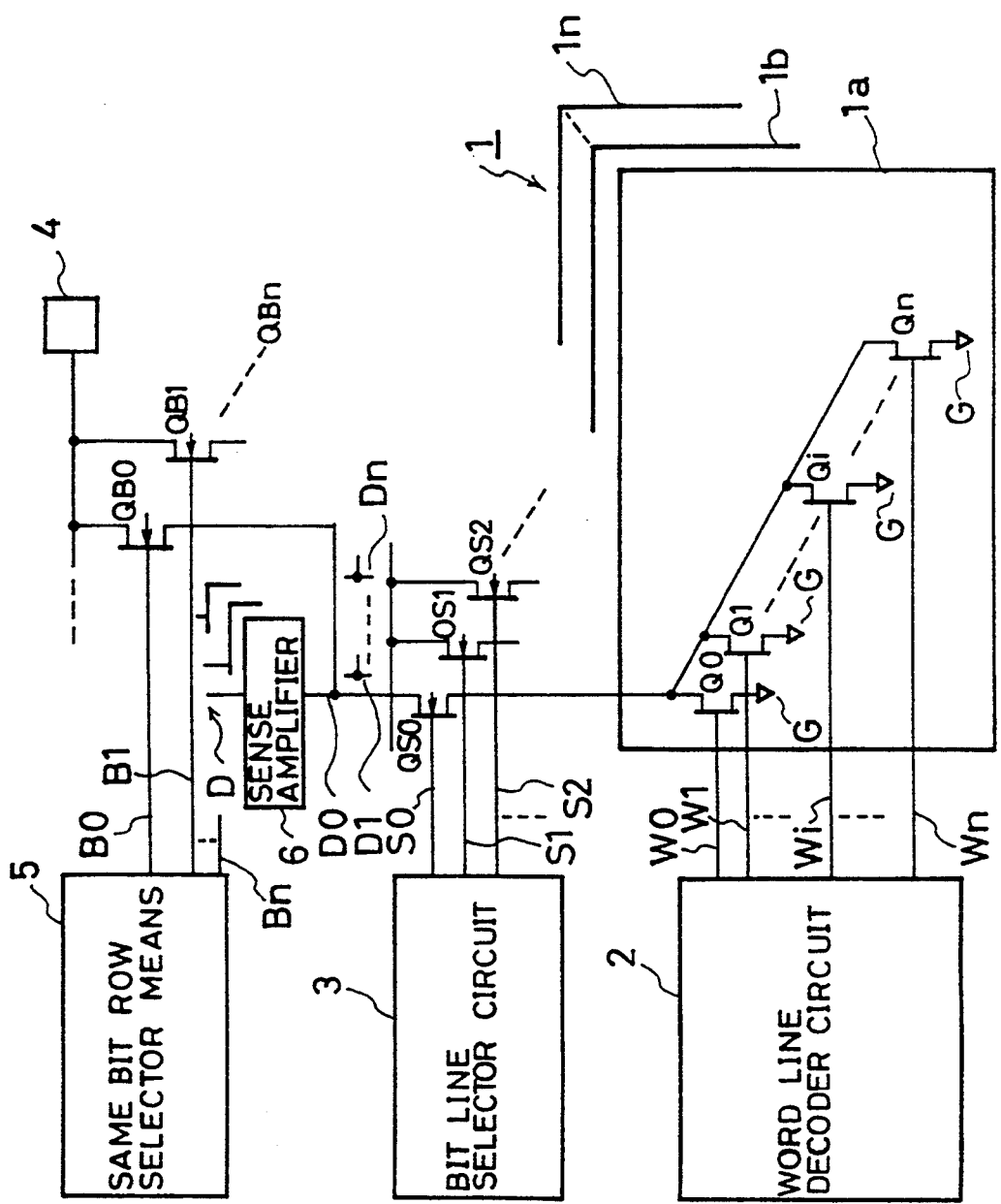
FIG. 1 is a view illustrating the arrangement of a non-volatile semiconductor device according to a first preferred embodiment of the present invention.
Figure 2:
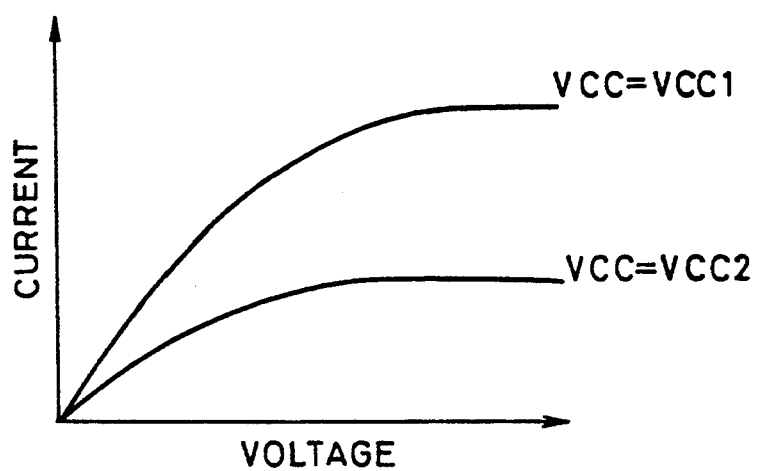
FIG. 2 is a view illustrating a voltage-current characteristic yielded in tile first preferred embodiment.

Referring to FIG. 1, symbols $1a, 1b, \ldots, 1n$ denote memory cell arrays, each memory cell array consisting of a plurality of memory cells arranged into a matrix fern and being connected with data output lines $D_0, D_1, \ldots, D_n$ of the same bit of a data bus D. The plurality of the memory cell arrays $1a, 1b, \ldots, 1n$ constitute a memory section 1. Each of $Q_0, Q_1, \ldots, Q_n$ is an FET as one memory cell. Numeral 2 denotes a word line decoder circuit as a selector circuit for designating word lines $W_0, W_1, \ldots, W_n$ connected to gates (control electrodes) of the FETs($Q_0, Q_1, \ldots, Q_n$), and numeral 3 denotes a bit line selector circuit as a selector circuit for designating bit lines $S_0, S_1, \ldots, S_n$ of the memory cell arrays $1a, 1b, \ldots, 1n$ and switching on selector FETs($QS_0, QS_2, \ldots$) as switching elements. Any bit line is designated by the bit line selector circuit 3, and data in one memory cell on each of the memory cell arrays 1a, 1b, ..., 1n connected with a word line designated by the word line decoder circuit 2 is read out on the data bus D via a sense amplifier 6 and is written by a write amplifier (not shown).

Numeral 4 denotes an external terminal, and 5 denotes same bit train selector means for selecting the memory cell arrays, i.e., those arrays of the same bit train. The same bit train selector means 5 possesses as output lines bit train selector lines $B_o, B_1, \ldots, B_n$ connected with gates of bit train selecting FETs($QB_o, QB_1, \ldots, QB_n$) as switching elements interconnected between the external terminal 4 and the data output lines $D_o, D_1, \ldots, D_n$ of the memory cell arrays 1a, 1b, ..., 1n. Any bit train selector line is designated by the same bit train selector means 5 to switch on any one bit train selecting FET, whereby there can be specified a memory cell on one memory cell array among the memory cells on the memory cell arrays 1a, 1b, ..., 1n selected by the word line decoder 2 and the line selector circuit 3 to form a current path extending from an FET of the specified memory cell to the external terminal 4.

Further, for tile foregoing same bit train selector means 5, it may be constructed with a terminal plate including terminals extending to the bit train selector lines $B_o, B_1, \ldots, B_n$ wherein voltage is applied to a terminal of a desired bit train selector line from the outside, and it may be constructed with a decoder circuit connected to a computer wherein the bit train selector lines $B_o, B_1, \ldots, B_n$ are successively automatically selected through a program.

Operation of the embodiment 1 is as follows: Upon inspection, the word line decoder circuit 2 and the bit line selector circuit 3 are connected with an observation computer, to which circuits 2, 3 an address is in turn supplied. Hereby, the word line decoder circuit 2 selects a specific memory cell FET, say $Q_i$, among the plurality of the memory cell FETs($Q_o, Q_1, \ldots, Q_n$) of the same bit train, on the memory cell array 1a for example. The word line $W_i$, i.e., the gate electrode of the memory cell FET $Q_i$ is supplied with power supply voltage $V_{cc}$.

The bit line selector circuit 3 selects a desired bit line among the plurality of the bit lines $S_o, S_1, \ldots$ in the same bit train, say $S_o$, and supplies the bit line $S_o$, i.e., the gate electrode of the selector FET $QS_o$ with voltage of a higher level than the power supply voltage $V_{cc}$. Hereby, the selector FET($QS_o$) is switched on. At this time, the sense amplifier 6, which is used for ordinary read operation, is kept inactive and is not operated.

Upon a desired bit train being selected by the same bit train selector means 5, the bit train selector line $B_o$, i.e., the gate electrode of the selecting FET $QB_o$ for example is selected and supplied with voltage of a higher level than the power supply voltage $V_{cc}$. Hereby, the bit train selecting FET($QB_o$) is switched on.

As a consequence of the above operation, there is formed a current path: external terminal 4→FET($QB_o$)→FET($QS_o$)→memory cell FET($Q_i$)→ground potential G. By applying arbitrary vol rage to the external terminal 4 and measuring a current flowing through the current path, such a voltage-current characteristic as illustrated in FIG. 2 is directly yielded. Herein, designated at $V_{cc1}$ and $V_{cc2}$ in FIG. 2 are two kinds of the power supply voltages $V_{cc}$ supplied to the external terminal and varied for measurement of the current.

It is important to notice a fact that the size (gate width) of the switching FETs ($QS_o, QB_o$ is much greater than the size (gate width) of the memory cell FET($Q_i$) in general, so that voltage drops across $QS_o$, $QB_o$ are ignorable compared with that across the memory cell FET ($Q_i$) (herein, the reason to supply higher voltage to the gate electrodes $QS_o$, $QB_o$ than the power supply voltage $V_{cc}$ supplied to the gate electrode of $Q_i$ is that the voltage drops across $QS_o$, $QB_o$ are to be further ignorable.). It may therefore be considered that the voltage-current characteristic of FIG. 2 substantially exhibits a drain voltage-drain current characteristic of the memory cell FET ($Q_i$) specified by the foregoing current path.

More strictly, the voltage drops across $QS_i$, $QB_i$ may be evaluated and corrected on the basis of measured current values from the following equation:

$$IDS = \beta((VGS-VTH)VDS - \tfrac{1}{2}VDS^2)$$

where
- IDS; drain-source current
- VGS; gate-source voltage
- VTH; threshold voltage
- VDS; drain-source voltage
- $\beta$; current amplification factor According to the present embodiment, as described above, voltage-current characteristics of all memory cell FETs are available directly and substantially accurately by selecting a specific memory cell FET, i.e., by selecting memory cells one by one with the aid of tile word line decoder circuit 2, the bit line selector circuit 3, and the same bit train selector means 5.

Figure 3:
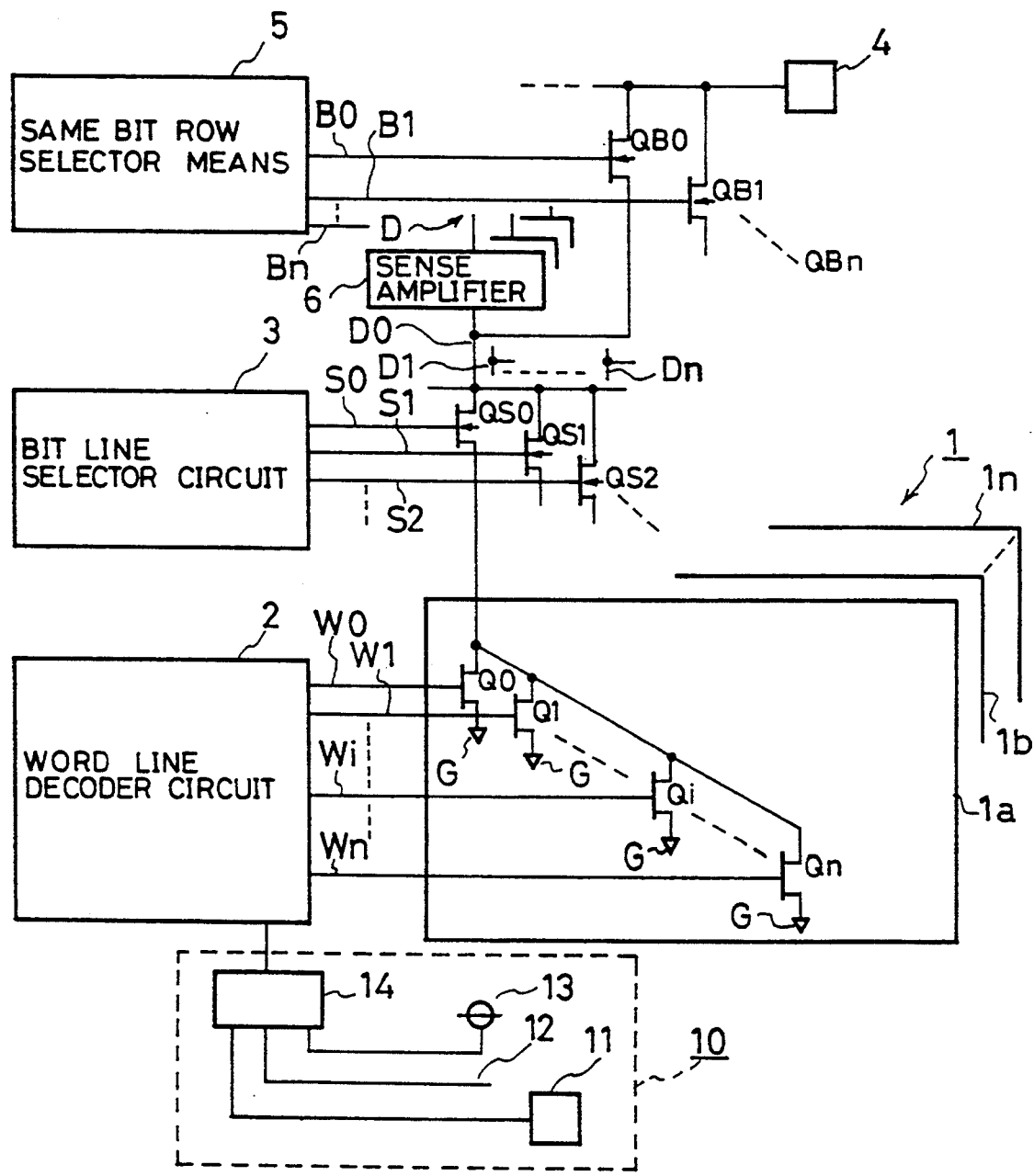
FIG. 3 is a view illustrating the arrangement of a non-volatile semiconductor memory device according to a second preferred embodiment of the present invention.

In the following, there will be described the second embodiment of the present invention with reference to FIG. 3. The present embodiment is different from the first embodiment in that a power supply circuit is additionally provided which is capable of altering the voltage supplied to the gates of the memory cell FETs through the word line.

To like parts as those in the first embodiment like symbols shall be applied and the description thereof will be omitted. In FIG. 3, designated at 10 is the power supply circuit which is to alter the voltage supplied to the word lines. The power supply circuit is formed with an external terminal 11, a switching signal line 12, power supply voltage 13, and a power supply switching circuit 14. The power supply voltage 13 and the external terminal 11 are switched each other by a switching signal, and an output from the power supply switching circuit 14 is used as a power supply for the word line decoder circuit 2. In the present embodiment, upon tile characteristics of any memory cell FET being measured, gate voltage of that memory cell FET can be altered by changing voltage to be supplied to the external terminal 11, so that threshold voltage of a specific memory cell FET, i.e., threshold voltage of each memory cell FET can be measured directly.

Further, as in the first embodiment, there is selected by the bit line selector circuit 3 a desired bit line among the plurality of the bit lines, $S_o, S_1 \ldots$ in the same bit train, say, $S_o$, and to that bit line $S_o$ higher level voltage than the foregoing power supply vol rage $V_{cc}$ is supplied. Likewise, there is selected by the same bit line selector means 5 the bit train selector line $B_o$ for example, and to that selector line $B_o$ higher level voltage than the power supply voltage $V_{cc}$ is supplied.

Although, in the above embodiment the higher voltage than the power supply voltage $V_{cc}$ was applied to both bit line $S_o$ and bit train selector line $B_o$, i.e., switching FETs($QS_o$, $QB_o$), higher level voltage may be applied to any one thereof.

Further, although in the above embodiments the memory cell elements were formed with the FETs, they may be constructed with bipolar transistors.

In accordance with the non-volatile semiconductor memory device of the present invention, there are provided a plurality of the memory cell arrays, each of which is formed with an element such as a transistor and an FET and which is connected with the same bit of the data bus, and are further provided the selector circuit for designating the word line of each memory cell array and switching on a control electrode of a memory cell element connected to the designated word line and the selector circuit for designating the bit line of each memory cell array, whereby data stored in a memory cell on each memory cell array selected by each selector circuit is read out/written in via the data bus. There are further provided in the non-volatile semiconductor memory device the external terminal, a plurality of the switching elements each for interconnecting the external terminal and each memory cell array and the same bit train selector means for selectivley switching on any switching element among those switching elements and forming the current path from a specific memory cell on a memory cell array of the same bit train to the external terminal, whereby a current is driven to flow through the foregoing specific memory cell via the current path by supplying the external terminal with arbitrary voltage. Thus, a voltage-current characteristic of a specific memory cell, i.e., of each memory cell can be measured directly and hence the yield and the accuracy of failure article analyses can be improved.

In accordance with another non-volatile semiconductor memory device of the present invention, there is provided the power supply circuit for supplying a control electrode of a specific memory cell with variable voltage, additionally to the above arrangement. Thus, a voltage-current characteristic and threshold voltage of each memory cell can be measured directly and hence the yield of articles and the accuracy of failure article analyses can be improved.

What is claimed is:

1. A non-volatile semiconductor memory device comprising:

a plurality of memory cell arrays coupled to a data bus, each said memory cell array comprising a plurality of memory cells, said plurality of memory cells comprising field effect transistors having a gate width;

a word line selector circuit for designating a word line of each said memory cell array and activating a gate electrode of said memory cell connected to a designated word line;

a plurality of bit line switching elements for interconnecting said data bus and said memory cell arrays, said plurality of bit line switching elements comprising field effect transistors, wherein a gate width of said plurality of bit line switching elements is much greater than said gate width of said plurality of memory cells;

a bit line selector circuit for designating a bit line of each said memory cell array and activating a gate electrode of one of said plurality of bit line switching elements, whereby data in any memory cell in each said memory cell array selected by each said selector circuit is read out or written in through said data bus;

an external terminal for receiving an arbitrary input voltage;

a plurality of same bit train switching elements for interconnecting said external terminal and said data bus, said plurality of same bit train switching elements comprising field effect transistors, wherein a gate width of said plurality of same bit train switching elements is greater than said gate width of said plurality of memory cells; and same bit train selector means for selecting and activating a gate electrode of one of said plurality of same bit train switching elements and forming a current path extending from a specific memory cell in said memory cell arrays of a selected same bit train to said external terminal, whereby a current is driven to flow through said specific memory cell via said current path by applying said arbitrary input voltage to said external terminal.

2. The non-volatile semiconductor memory device of claim 1, wherein said bit line selector circuit applies to said gate electrode of one of said plurality of bit line switching elements a voltage greater than a voltage applied to said gate electrode of said memory cell via said designated word line.

3. The non-volatile semiconductor memory device of claim 1, wherein said same bit train selector means applies to said gate electrode of one of said plurality of same bit train switching elements a voltage greater than a voltage applied to said gate electrode of said memory cell via said designated word line.

4. A non-volatile semiconductor memory device comprising:

a plurality of memory cell arrays coupled to a data bus, each said memory cell array comprising a plurality of memory cells, said plurality of memory cells comprising field effect transistors having a gate width;

a word line selector circuit for designating a word line of each said memory cell array and activating a gate electrode of said memory cell connected to a designated word line;

a plurality of bit line switching elements for interconnecting said data bus and said memory cell arrays, said plurality of bit line switching elements comprising field effect transistors, wherein a gate width of said plurality of bit line switching elements is greater than said gate width of said plurality of memory cells;

a bit line selector circuit for designating a bit line of each said memory cell array and activating a gate electrode of one of said plurality of bit line switching elements, whereby data in any memory cell in each said memory cell array selected by each said selector circuit is read out or written in through said data bus;

an external terminal for receiving an arbitrary input voltage;

a plurality of same bit train switching elements for interconnecting said external terminal and said data bus, said plurality of same bit train switching elements comprising field effect transistors, wherein a gate width of said plurality of same bit train switching elements is greater than said gate width of said plurality of memory cells;

same bit train selector means for selecting and activating a gate electrode of one of said plurality of same bit train switching elements and forming a current path extending from a specific memory cell in said memory cell arrays of a selected same bit train to said external terminal, whereby a current is driven to flow through said specific memory cell via said current path by applying said arbitrary input voltage to said external terminal; and a power supply circuit for supplying to said gate electrode of said specific memory cell a variable voltage via said word line designated by said word line selector circuit, whereby a threshold voltage of said specific memory cell is measured.

5. The non-volatile semiconductor memory device of claim 4, wherein said power supply circuit comprises:

an external terminal for receiving said variable voltage;

a power supply voltage;

a power supply switching circuit for supplying a selected voltage to said word line selector circuit; and a switching signal line for selecting one of said variable voltage and said power supply voltage.

6. The non-volatile semiconductor memory device of claim 4, wherein said bit line selector circuit applies to said gate electrode of one of said plurality of bit line switching elements a voltage greater than a voltage applied to said gate electrode of said memory cell via said designated word line.

7. The non-volatile semiconductor memory device of claim 4, wherein said same bit train selector means applies to said gate electrode of one of said plurality of same bit train switching elements a voltage greater than a voltage applied to said gate electrode of said memory cell via said designated word line.

8. A method of measuring electrical characteristics of a specific memory cell in a non-volatile semiconductor memory device directly, comprising the steps of:

designating a word line in the non-volatile semiconductor memory device using a word line selector circuit;

designating a bit line in the non-volatile semiconductor memory device using a bit line selector circuit;

selecting the specific memory cell by designating said word line and said bit line;

designating a same bit train and activating a same bit train switching element using a same bit train selector circuit, forming a current path extending from the specific memory cell of said designated same bit train to an external terminal, bypassing a write amplifier in said semiconductor memory device;

applying an arbitrary input voltage to said external terminal, whereby a current is driven to flow through said specific memory cell via said current path by applying said arbitrary input voltage to said external terminal; and observing the current response of said specific memory cell to said arbitrary input voltage at said external terminal, bypassing a sense amplifier in said semiconductor memory device.

9. A method of measuring a threshold voltage of a specific memory cell in a non-volatile semiconductor memory device, comprising the steps of:

designating a word line in the non-volatile semiconductor memory device using a word line selector circuit;

designating a bit line in the non-volatile semiconductor memory device using a bit line selector circuit;

selecting the specific memory cell by designating said word line and said bit line;

supplying a variable voltage to the non-volatile semiconductor memory device on an external terminal;

selecting one of a power supply voltage and said variable voltage as a selected voltage to be applied to the specific memory cell;

applying said selected voltage on said word line to the specific memory cell;

measuring the threshold voltage of the specific memory cell.

* * * * *